United States Patent
Watanabe

(10) Patent No.: US 11,804,567 B2
(45) Date of Patent: Oct. 31, 2023

(54) III-NITRIDE SEMICONDUCTOR LIGHT-EMITTING DEVICE AND METHOD OF PRODUCING THE SAME

(71) Applicant: DOWA Electronics Materials Co., Ltd., Tokyo (JP)

(72) Inventor: Yasuhiro Watanabe, Akita (JP)

(73) Assignee: DOWA Electronics Materials Co., Ltd., Tokyo (JP)

( * ) Notice: Subject to any disclaimer, the term of this patent is extended or adjusted under 35 U.S.C. 154(b) by 466 days.

(21) Appl. No.: 17/280,419

(22) PCT Filed: Sep. 25, 2019

(86) PCT No.: PCT/JP2019/037707
§ 371 (c)(1),
(2) Date: Mar. 26, 2021

(87) PCT Pub. No.: WO2020/067215
PCT Pub. Date: Apr. 2, 2020

(65) Prior Publication Data
US 2021/0359159 A1    Nov. 18, 2021

(30) Foreign Application Priority Data

Sep. 28, 2018    (JP) ................................. 2018-184555
Sep. 25, 2019    (JP) ................................. 2019-174556

(51) Int. Cl.
*H01L 33/14*    (2010.01)
*H01L 33/32*    (2010.01)
*H01L 33/00*    (2010.01)
*H01L 33/02*    (2010.01)

(52) U.S. Cl.
CPC .......... *H01L 33/007* (2013.01); *H01L 33/025* (2013.01); *H01L 33/145* (2013.01); *H01L 33/32* (2013.01)

(58) Field of Classification Search
CPC ... H01L 33/007; H01L 33/025; H01L 33/145; H01L 33/32; H01L 33/325
See application file for complete search history.

(56) References Cited

U.S. PATENT DOCUMENTS

2017/0309785 A1 * 10/2017 Watanabe ............. H01L 33/325
2018/0019375 A1 * 1/2018 Fujita ..................... H01L 33/32

FOREIGN PATENT DOCUMENTS

CN    103337568 B  *  1/2016
CN    106684218 A      5/2017
(Continued)

OTHER PUBLICATIONS

Dec. 3, 2019, International Search Report issued in the International Patent Application No. PCT/JP2019/037707.
Dec. 3, 2019, Notification of Reasons for Refusal issued by the Japan Patent Office in the corresponding Japanese Patent Application No. 2019-174556.
Oct. 22, 2020, Notification of Reasons for Revocation issued by the Japan Patent Office in the corresponding Japanese Patent No. 6654731.
(Continued)

*Primary Examiner* — Robert G Bachner
*Assistant Examiner* — Molly K Reida
(74) *Attorney, Agent, or Firm* — KENJA IP LAW PC

(57) ABSTRACT

Provided are a III-nitride semiconductor light-emitting device that can reduce change in the light output power with time and has more excellent light output power, and a method of producing the same. A III-nitride semiconductor light-emitting device 100 has an emission wavelength of 200 nm to 350 nm, and includes an n-type layer 30, a light emitting layer 40, an electron blocking layer 60, and a p-type contact layer 70 in this order. The electron blocking layer 60 has a co-doped region layer 60c, the p-type contact layer 60 is made of p-type $Al_xGa_{1-x}N$ ($0 \le x \le 0.1$), and the p-type contact layer 60 has a thickness of 300 nm or more.

6 Claims, 2 Drawing Sheets

(56) References Cited

FOREIGN PATENT DOCUMENTS

| CN | 107808916 A | * | 3/2018 | ......... H01L 21/0242 |
|---|---|---|---|---|
| JP | H1125687 A | | 1/1999 | |
| JP | H11251687 A | | 9/1999 | |
| JP | 2008521248 A | | 6/2008 | |
| JP | 2009529230 A | | 8/2009 | |
| JP | 2013165261 A | | 8/2013 | |
| JP | 2015119108 A | | 6/2015 | |
| JP | 2016149544 A | | 8/2016 | |
| JP | 2016213448 A | | 12/2016 | |
| JP | WO2015151471 A1 | | 4/2017 | |
| JP | 2018093160 A | | 6/2018 | |
| JP | 2018121028 A | | 8/2018 | |
| JP | 2018125430 A | | 8/2018 | |

OTHER PUBLICATIONS

Jun. 29, 2021, Notice of Reasons for Revocation issued by the Japan Patent Office in the corresponding Japanese Patent No. 6654731.

Michiko Kaneda et al., Uneven AlGaN multiple quantum well for deep-ultraviolet LEDs grown on macrosteps and impact on electroluminescence spectral output, Japanese Journal of Applied Physics, 2017, pp. 061002-1 to 061002-9, vol. 56.

Mar. 23, 2021, International Preliminary Report on Patentability issued in the International Patent Application No. PCT/JP2019/037707.

Jan. 11, 2022, Decision on Opposition issued by the Japan Patent Office in the corresponding Japanese Patent No. 6654731.

Yosuke Nagasawa et al., A Review of AlGaN-Based Deep-Ultraviolet Light-Emitting Diodes on Sapphire, Applied Sciences, 2018, pp. 1-36, vol. 8.

* cited by examiner

III-NITRIDE SEMICONDUCTOR LIGHT-EMITTING DEVICE AND METHOD OF PRODUCING THE SAME

TECHNICAL FIELD

This disclosure relates to a III-nitride semiconductor light-emitting device and a method of producing the same. This disclosure relates in particular to a III-nitride semiconductor light-emitting device that is excellent in both reliability and light output power, and a method of producing the same.

BACKGROUND

Conventionally, III-nitride semiconductors made of compounds in which N is combined with Group III elements such as Al, Ga, In, etc. are used as materials for light-emitting devices emitting blue to deep ultraviolet light. III-nitride semiconductors made of AlGaN having a high Al composition ratio are particularly used for deep ultraviolet light-emitting devices (DUV-LEDs) emitting light at a wavelength of 200 nm to 350 nm.

In general, deep ultraviolet light-emitting devices using III-nitride semiconductors exhibit significantly low light emission efficiency and achieving higher output using such a device has been said to be difficult. Meanwhile, various attempts have been made to achieve high light extraction efficiency and low resistance properties in addition to improved internal quantum efficiency with a view to obtaining a small and high-output deep ultraviolet light-emitting device.

Here, a p-type contact layer (p-type AlGaN layer having an Al composition ratio of 0% or more and less than 10%) absorbs ultraviolet light emitted from an active layer. In this regard, JP 2016-213448 A (PTL 1) discloses a III-nitride semiconductor light-emitting device of an emission wavelength of 355 nm that has an opening obtained by partially removing a p-type contact layer so that the p-type cladding layer is exposed in the opening. The thickness of the p-type contact layer in PTL 1 is assumed to be 20 nm in conventional techniques in which the partial removal is not performed, and is assumed to be 200 nm in an embodiment in which the partial removal is performed.

Not only according to PTL 1, it is said to be desirable that a p-type contact layer which absorbs ultraviolet light emitted from an active layer should be thin because of negative effects caused by the light absorption by the layer, and the thickness of such a p-type contact layer has been typically set to 200 nm or less.

Further, the inventor of this disclosure proposes, in PTL 2, a highly reliable III-nitride semiconductor light-emitting device for which change in the light output power with time is reduced by providing a Si-based doped layer in an electron blocking layer.

CITATION LIST

Patent Literature

PTL 1: JP 2016-213448 A
PTL 2: JP 2016-149544 A

SUMMARY

Technical Problem

Although various attempts have been made, there is still a demand for III-nitride semiconductor light-emitting device for which change in the light output power is reduced and more excellent light output power is achieved.

It could therefore be helpful to provide a III-nitride semiconductor light-emitting device that can reduce change in the light output power with time and has more excellent light output power, and a method of producing the same.

Solution to Problem

The inventor made diligent studies to address the above challenges and investigated the influence of the thickness of a p-type contact layer in cases where a co-doped region layer is formed in an electron blocking layer and cases where a co-doped region layer is not formed. Thus, it was found that when a co-doped region layer is formed, change in the light output power with time can be reduced and an excellent light output power can be obtained by purposely increasing the thickness of a p-type contact layer contrary to conventional wisdom in the art.

We propose the following features based on the above discoveries.

(1) A III-nitride semiconductor light-emitting device having an emission wavelength of 200 nm to 350 nm, comprising an n-type layer, a light emitting layer, an electron blocking layer, and a p-type contact layer in this order,
  wherein the electron blocking layer has a co-doped region layer,
  the p-type contact layer is made of p-type $Al_xGa_{1-x}N$ ($0 \leq x \leq 0.1$), and
  a thickness of the p-type contact layer is 300 nm or more.

(2) The III-nitride semiconductor light-emitting device according to (1) above, wherein the thickness of the p-type contact layer is 500 nm or more and 1500 nm or less.

(3) The III-nitride semiconductor light-emitting device according to (1) or (2) above, wherein a thickness of the electron blocking layer is 10 nm or more and 30 nm or less.

(4) The III-nitride semiconductor light-emitting device according to any one of (1) to (3) above, wherein the co-doped region layer contains a p-type impurity at $1 \times 10^{18}$ atoms/cm$^3$ to $1 \times 10^{20}$ atoms/cm$^3$ and an n-type impurity at $1 \times 10^{18}$ atoms/cm$^3$ to $1 \times 10^{20}$ atoms/cm$^3$.

(5) The III-nitride semiconductor light-emitting device according to (4) above, wherein the p-type impurity in the co-doped region layer is Mg, and the n-type impurity in the co-doped region layer is Si.

(6) A method of producing a III-nitride semiconductor light-emitting device having an emission wavelength of 200 nm to 350 nm, comprising a step of forming an n-type layer, a step of forming a light emitting layer, a step of forming an electron blocking layer, and a step of forming a p-type contact layer,
  wherein the step of forming the electron blocking layer includes a step of forming a co-doped region layer in the electron blocking layer, and
  in the step of forming the p-type contact layer, the p-type contact layer is made of p-type $Al_xGa_{1-x}N$ ($0 \leq x \leq 0.1$), and a thickness of the p-type contact layer is 300 nm or more.

Advantageous Effect

This disclosure can provide a III-nitride semiconductor light-emitting device that can reduce change in the light output power with time and has more excellent light output power compared with conventional devices.

DETAILED DESCRIPTION

Figure 1:
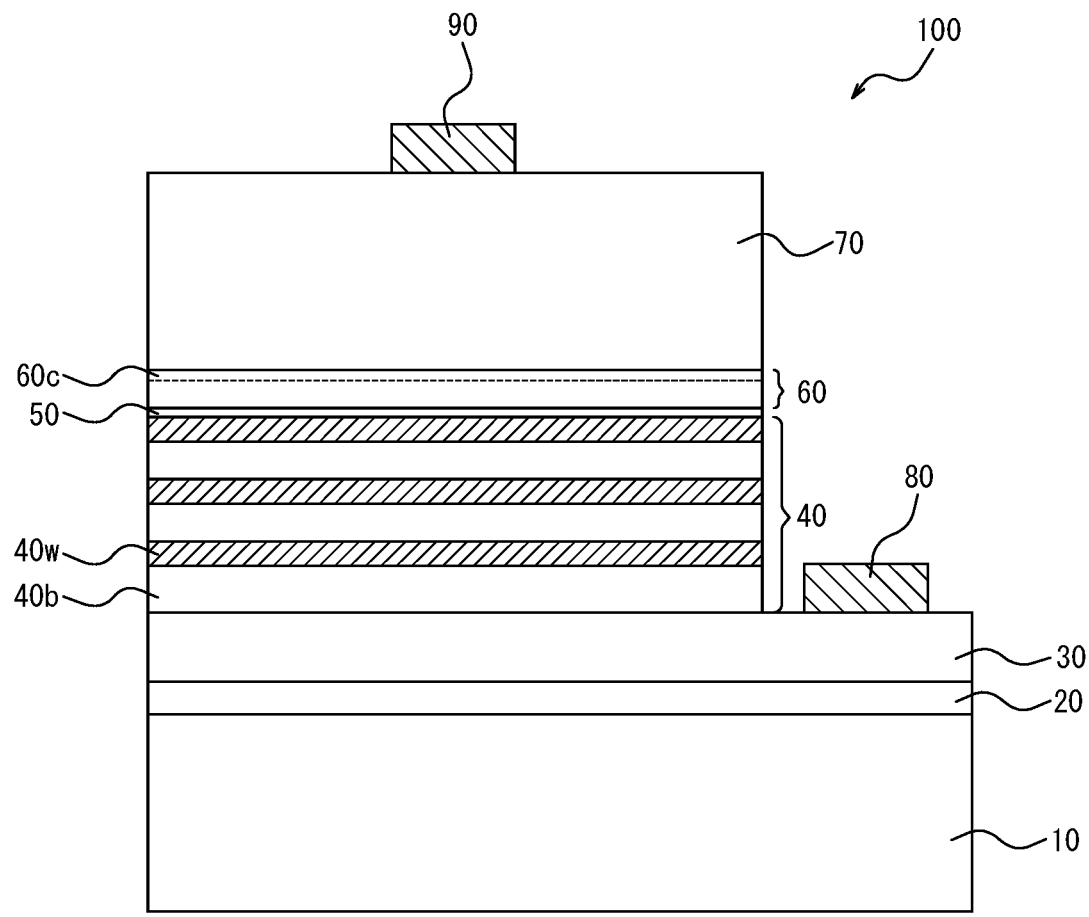
FIG. 1 is a schematic cross-sectional view illustrating a III-nitride semiconductor light-emitting device according to one embodiment of this disclosure.

A method of measuring the thickness of each layer formed by epitaxial growth and its Al composition ratio will be described, followed by description of an embodiment. The thickness of each layer can be measured using an optical interferometric thickness measurement system. Further, when the composition ratios of adjacent layers are sufficiently different (for example, the difference between the Al composition ratios is 0.01 or more), the thickness of each layer can also be calculated by observing the cross sections of the grown layers using a transmission electron microscope. For two of the adjacent layers that have the same or substantially the same Al composition ratios (for example, the difference is less than 0.01) but have different impurity concentrations, the boundary and the thickness of such two adjacent layers are found based on TEM-EDS data. Further, for layers including barrier layers and an electron blocking layer that each have a thickness as small as several nanometers to several tens of nanometers, the thickness and the Al composition ratios of the layers can be measured by TEM-EDS by performing a cross-sectional observation under a transmission electron microscope. Further, for layers having a sufficiently large thickness (for example of 1 µm or more), the Al composition ratio of each target layer can be found from the emission wavelength (band gap energy) obtained by a photoluminescence measurement.

(III-Nitride Semiconductor Light-Emitting Device)

Embodiments of this disclosure will now be described with reference to FIG. 1. In principle, like components are denoted by like reference numerals, and the description will not be repeated. A substrate and layers in the diagram are exaggerated in thickness for convenience of description, so that the ratio between the vertical and horizontal dimensions of each illustrated component does not conform to the actual ratio.

A III-nitride semiconductor light-emitting device 100 according to one embodiment of this disclosure has an n-type layer 30, a light emitting layer 40, an electron blocking layer 60, and a p-type contact layer 70 in this order. As illustrated in FIG. 1, in one of the preferred aspects, barrier layers 40b and well layers 40w having a band gap smaller than the barrier layers 40b are alternately stacked in the light emitting layer 40. Further, as also illustrated in FIG. 1, it is also preferred that an AlN guide layer 50 is provided between the light emitting layer 40 and the electron blocking layer 60.

As illustrated in FIG. 1, the n-type layer 30 of the III-nitride semiconductor light-emitting device 100 can be provided on an AlN template substrate in which an AlN layer 20 is provided on a surface of a substrate 10. Further, the III-nitride semiconductor light-emitting device 100 may be provided with an n-type electrode 80 formed on the n-type layer 30 exposed by removing parts of the light emitting layer 40, the AlN guide layer 50, the electron blocking layer 60, and the p-type contact layer 70 by etching etc.; and may be provided with a p-type electrode 90 formed on the p-type contact layer 70. The substrate 10, the AlN layer 20, the n-type electrode 80, and the p-type electrode 90 may have a typical structure and the structure is not limited. Although not illustrated, one or more buffer layers that are selected from an AlGaN layer, a composition graded layer, and a superlattice layer may be provided between the AlN layer 20 and the n-type layer 30.

<n-Type Layer>

The n-type layer 30 may be a III-nitride semiconductor layer containing at least Al, and for example may be made of an AlGaN material which may contain In in an amount of 5% or less of the amount of Al and Ga as group III elements. The n-type layer 30 is doped with an n-type impurity (dopant). Examples of such an n-type impurity include Si, Ge, Sn, S, O, Ti, and Zr. The impurity concentration is also not limited as long as n-type characteristics can be achieved, and the impurity concentration may be, for example, $1.0 \times 10^{18}$ atoms/cm$^3$ to $1.0 \times 10^{20}$ atoms/cm$^3$. Further, the Al content of the n-type layer 30 is not particularly limited and may be within a typical range. The n-type layer 30 may be constituted by a single layer or a plurality of layers.

<Light Emitting Layer>

In the III-nitride semiconductor light-emitting device 100, the light emitting layer 40 is provided following the formation of the n-type layer 30. The light emitting layer 40 may be formed by alternately stacking the barrier layers 40b and the well layers 40w having a band gap smaller than the barrier layers 40b. For example, for the barrier layers 40b and the well layers 40w, AlGaN materials having different Al composition ratios may be used. If necessary, the barrier layers 40b and the well layers 40w may be made of for example an AlGaInN material in which a group III element such as In is contained in a composition ratio of 5% or less; and, an AlGaN ternary system material using only Al and Ga as group III elements is preferred. Each layer in the light emitting layer 40 may be of n-type or i-type; however, the barrier layers 40b are preferably of n-type. This increases the electron concentration, resulting in passivation of crystal defects in the well layers. Note that the light emitting layer 40 may have a typical multiple quantum well (MQW) structure in which barrier layers and well layers are repeatedly formed to form a stack sandwiched between barrier layers, or may have a structure in which the barrier layer in contact with the p-type layer is removed from the typical MQW structure so that N barrier layers 40b and N well layers 40w (where N is an integer) are alternately stacked.

When an $Al_bGa_{1-b}N$ material is used for the barrier layers 40b, and an $Al_wGa_{1-w}N$ material is used for the well layers 40w, the Al composition ratio b of each barrier layer 40b may be, for example, 0.51 to 0.95, more preferably 0.53 to 0.85, and the Al composition ratio w of each well layer 40w may be, for example, 0.30 to 0.80 (where w<b). Further, the numbers of the barrier layers 40b and the well layers 40w may be positive integers, for example, from 1 to 10. Further, the thickness of the barrier layers 40b may be 3 nm to 30 nm, and the thickness of the well layers 40 w may be 0.5 nm to 5 nm.

The center wavelength of light emitted can be roughly controlled by appropriately selecting the Al composition ratio of the well layers 40w; for example, when the Al composition ratio w of well layers 40w in the light emitting layer 40 is 0.35 or more, the center wavelength of light emitted from the light emitting layer 40 is 300 nm or less.

<n-Type Guide Layer>

Although not illustrated in FIG. 1, it is also preferred that an n-type guide layer is provided between the light emitting layer 40 and the n-type layer 30. The n-type guide layer preferably uses an AlGaN material, and it is preferred that the Al composition ratio of the n-type guide layer is equal to or more than the Al composition ratio of the n-type layer 30 and is equal to or less than the Al composition ratio b of the barrier layers 40b. The thickness of the n-type guide layer may be 3 nm to 30 nm. Further, the n-type guide layer is preferably doped with an n-type impurity (dopant) as with the n-type layer, and the amount of the impurity added is preferably smaller than that for the n-type layer.

<AlN Guide Layer>

Subsequent to the formation of the light emitting layer 40, the AlN guide layer 50 may be provided on the light emitting layer 40. The AlN guide layer 50 is most preferably a nitride semiconductor layer made of AlN, in which the composition ratio of Al is 100% of group III elements. Note however that considering cases where other group III elements (such as Ga) are inevitably mixed during the production process, gas produced during alteration and the state of process of the alteration, the AlN guide layer 50 may include layers having an Al composition ratio of 96% to 100%. The thickness of the AlN guide layer 50 is preferably 0.5 nm or more and 2.0 nm or less, more preferably 0.7 nm or more and 1.7 nm or less. The AlN guide layer 50 is preferably undoped; however, a p-type impurity such as Mg or an n-type impurity such as Si may be added to the AlN guide layer 50. Further, the impurity concentration in the AlN guide layer 50 is not necessarily homogeneous; for example, the impurity concentration may differ between the light emitting layer 40 side and the electron blocking layer 60 side. When an impurity is added, the AlN guide layer 50 may be partially or wholly of p-type or n-type in the end instead of being of i-type.

A layer of "i-type" refers to a layer which is not designed to be doped with specific impurities (also referred to as "undoped layer"). Ideally, a semiconductor completely free of impurities is preferred, yet a semiconductor that does not serve as either a p-type or n-type electrical conductor may be used, and one having a low carrier density (for example, less than $5 \times 10^{16}$ atoms/cm$^3$) can be referred to as an i-type semiconductor. It should be noted that even when p-type or n-type impurities diffuse from adjacent semiconductor layers, the AlN guide layer 50 is not designed to be doped with specific impurities.

It is also preferred that the III-nitride semiconductor light-emitting device 100 additionally has a final barrier layer having a band gap that is equal to or more than that of the barrier layers 40b and is less than the AlN guide layer 50 between the Nth well layer 40w from the AlN guide layer 50 and the AlN guide layer 50 in the light emitting layer 40. In this case, the thickness of the final barrier layer provided is preferably significantly thin as 0.1 nm or more and 1.0 nm or less.

<Electron Blocking Layer>

Subsequently, the electron blocking layer 60 is provided on the light emitting layer 40. In an embodiment illustrated in FIG. 1, the electron blocking layer 60 is provided in contact with the AlN guide layer 50. The electron blocking layer 60 is typically provided between a multiple quantum well (MQW) structure serving as a light emitting layer and a p-type layer (a p-type cladding layer or a p-type contact layer) to stop electrons so as to be used as a layer that allows the electrons to be injected into the light emitting layer (the well layers in the case of the MQW) thereby improving the electron injection efficiency. When the Al composition ratio of the light emitting layer is high, the hole concentration in the p-type contact layer 70 is low, which makes it difficult to inject holes into the light emitting layer, in which case, the electrons would partly flow toward the p-type contact layer 70 side. The provision of the electron blocking layer 60 can avoid such a flow of electrons. Also in this embodiment, the electron blocking layer 60 provided to be adjacent to the AlN guide layer 50 can avoid the flow of electrons to the p-type contact layer 70 side in a similar manner and can increase the electron injection efficiency.

The Al composition ratio of the electron blocking layer 60 is preferably $Al_zGa_{1-z}N$ ($0.5 \leq z \leq 0.8$). The thickness of the whole electron blocking layer may be 5 nm or more and 40 nm or less, and is more preferably 10 nm or more and 30 nm or less.

The electron blocking layer 60 according to this disclosure contains at least a p-type impurity (Mg, Zn, Ca, Be, Mn, etc.) added as a dopant to the electron blocking layer; of these, the most preferred p-type impurity is Mg. Further, the electron blocking layer 60 has a co-doped region layer 60c containing an n-type impurity typified by Si in addition to the p-type impurity.

The amount of the p-type impurity in the electron blocking layer 60 can be measured by SIMS analysis, and is preferably, for example, $1.0 \times 10^{18}$ atoms/cm$^3$ to $5.0 \times 10^{20}$ atoms/cm$^3$ on average. The amount of the n-type impurity can also be measured by SIMS analysis, and the electron blocking layer 60 has the co-doped region layer 60c containing both the p-type impurity and the n-type impurity at $1 \times 10^{18}$ atoms/cm$^3$ or more each. The co-doped region layer 60c preferably has a p-type (for example, Mg) impurity concentration of $1 \times 10^{18}$ atoms/cm$^3$ to $1 \times 10^{20}$ atoms/cm$^3$ and an n-type (for example, Si) impurity concentration of $1 \times 10^{18}$ atoms/cm$^3$ to $1 \times 10^{20}$ atoms/cm$^3$, and the total impurity concentration of p-type and n-type impurities is preferably $2 \times 10^{18}$ atoms/cm$^3$ to $2 \times 10^{20}$ atoms/cm$^3$. Both impurity concentrations can be measured by SIMS analysis. If a region having p-type and n-type impurity concentrations within the above range is found to be present by SIMS analysis on the electron blocking layer, the region is considered to have a co-doped region layer. In the co-doped region layer 60c, the p-type impurity concentration may be either higher or lower than the n-type impurity concentration, and the p-type and n-type impurity concentrations may be approximately the same (the n-type impurity concentration may be approximately 0.8 to 1.2 when the p-type impurity concentration is 1).

FIG. 1 illustrates an example of providing the co-doped region layer 60c on the p-type contact layer 70 side of the electron blocking layer 60. However, the co-doped region layer 60c is not limited to this example. The entire electron blocking layer 60 may form a co-doped region layer; alternatively, only a part of the electron blocking layer 60 may be a co-doped region layer and a region containing only a p-type impurity may be present in the other part. The thickness of the co-doped region layer is preferably 1 nm or more. The thickness of the co-doped region layer is measured using TEM-EDS. Further, the thickness of the co-doped region layer is preferably 10 nm or less, and more preferably 5 nm or less. A thickness exceeding 10 nm causes the resistance to be high, which would result in a high forward voltage.

Note that the electron blocking layer 60 preferably has a region doped with only a p-type impurity without being doped with an n-type impurity, between the MN guide layer 50 and the co-doped region layer 60c.

When the electron blocking layer 60 has the co-doped region layer 60c, the hole injection efficiency is increased by doping the co-doped region layer 60c with for example Mg to maintain a light output power and reduce the forward voltage, and the diffusion of Mg from the p-type contact layer into the light emitting layer is controlled by doping with Si, thus the life of the device to be obtained will be prevented from being affected.

<p-Type Contact Layer>

Subsequent to the formation of the electron blocking layer 60, the p-type contact layer 70 is provided. The p-type contact layer 70 is $Al_xGa_{1-x}N$ ($0 \leq x \leq 0.1$). Examples of the p-type impurity to be added to the p-type contact layer 70 include Mg, Zn, Ca, Be, Mn, etc. Further, the average impurity concentration of the whole p-type contact layer 70 is also not limited as long as p-type characteristics can be achieved, and the impurity concentration may be, for example, $1.0 \times 10^{18}$ atoms/cm$^3$ to $5.0 \times 10^{21}$ atoms/cm$^3$.

The p-type contact layer 70 preferably has a high concentration region with a Mg concentration of $3 \times 10^{20}$ atoms/cm$^3$ or more on the side in contact with the p-type electrode 90, and the Mg concentration of the high concentration region is more preferably $5 \times 10^{20}$ atoms/cm$^3$ or more. The thickness of the high concentration region is typically 15 nm or less. The Mg concentrations of the high concentration region and the region other than the high concentration region are average concentrations determined by SIMS measurements.

Conventionally, the thickness of the p-type contact layer 70 is typically 200 nm or less. Since a p-type contact layer absorbs light from the light emitting layer 40, the thickness of the p-type contact layer is typically made thin to control the absorption. On the other hand, making the p-type contact layer thick has been considered to provide no benefit. However, according to this disclosure, it was found that when the electron blocking layer 60 has the co-doped region layer 60c, the thickness of the p-type contact layer 70 is preferably 300 nm or more, more preferably 500 nm or more and 1500 nm or less to obtain high light output power.

The p-type contact layer needs to have a some degree of thickness so that a current is diffused in the layer; however, when the electron blocking layer 60 does not have the co-doped region layer 60c, the current is predominantly flows into the electron blocking layer 60 rather than being diffused in the p-type contact layer 70. Therefore, in conventional techniques, as the p-type contact layer 70 is thicker, the light emission efficiency is lower, and this may be the reason that the thickness of the p-type contact layer has been believed to be necessarily 200 nm or less. However, when the electron blocking layer 60 has the co-doped region layer 60c, the current is assumed to be predominantly diffused in the p-type contact layer 70 rather than being flown into the co-doped region layer 60c of the electron blocking layer 60. When the thickness of the p-type contact layer 70 is 200 nm or less, the diffusion of a current hardly contributes to the improvement in the light emission efficiency; on the other hand, when the thickness is 300 nm or more, the improvement in the light emission efficiency due to the current diffusion surpasses the negative effects caused by the absorption of light, this is expected to improve the light output power in the end.

As described above, the III-nitride semiconductor light-emitting device according to this disclosure has the co-doped region layer 60c and the p-type contact layer 70 with a thickness of 300 nm or more, so that change in the light output power with time can be reduced and more excellent light output power compared with conventional devices can be achieved.

Specific aspects of the substrate 10, the AlN layer 20, the n-type electrode 80, and the p-type electrode 90 depicted in FIG. 1 will be described below by way of example, yet various modifications are possible. As stated above, in the disclosed embodiments, the sapphire substrate 10, the AlN layer 20, the n-type electrode 80, and the p-type electrode 90 depicted in FIG. 1 do not limit this disclosure in any way.

A sapphire substrate can be used as the substrate 10 of the III-nitride semiconductor light-emitting device 100. An AlN template substrate in which the AlN layer 20 is epitaxially grown on a surface of the sapphire substrate may be used. Any given sapphire substrate can be used as the sapphire substrate, and the substrate may optionally have an off-angle. When an off-angle is provided, the crystallographic orientation in the tilt direction may be either in the m axis direction or in the a axis direction. For example, a main surface of the sapphire substrate may be the C plane tilted at an off-angle of 0.5°. When the AlN template substrate is used, the crystallinity of the AlN layer on the surface of the sapphire substrate is preferably excellent. Further, a surface of the AlN template substrate is preferably provided with an undoped AlGaN layer. Alternatively, an AlN single crystal substrate may be used as the substrate 10.

The n-type electrode 80 may be, for example, a metal composite film having a Ti-containing film and an Al-containing film formed on the Ti-containing film. The thickness, shape, and size of each of these films in the n-type electrode may be selected as appropriate in accordance with the shape and the size of the light-emitting device. On the other hand, the p-type electrode 90 may be, for example, a metal composite film having a Ni-containing film and an Au-containing film formed on the Ni-containing film. The thickness, shape, and size of these films in the p-type electrode may be appropriately selected in accordance with the shape and size of the light-emitting device.

(Method of Producing III-Nitride Semiconductor Light-Emitting Device)

Next, an embodiment of a method of producing the III-nitride semiconductor light-emitting device 100 described above will be described. This production method includes a step of forming the n-type layer 30, a step of forming the light emitting layer 40, a step of forming the electron blocking layer 60, and a step of forming the p-type contact layer 70 in this order. The step of forming the electron blocking layer 60 includes a step of forming a co-doped region layer 60c in the electron blocking layer 60. Further, in the step of forming the p-type contact layer 70, the p-type contact layer 70 is p-type $Al_xGa_{1-x}N$ ($0 \leq x \leq 0.1$) and the thickness of the p-type contact layer 70 is 300 nm or more. The steps, including preferred embodiments thereof, will be described in succession. Note that the features that overlap the features in the above-described embodiments of the III-nitride semiconductor light-emitting device 100 are denoted by the same reference numerals, and the description will not be repeated.

Typically, a sapphire substrate is prepared first as the substrate 10. An AlN template substrate in which an AlN layer is formed on a surface 10A of the substrate 10 is preferably formed, and a commercially available AlN template substrate may be used. The AlN layer 20 can be formed by a known thin film deposition technique, for example, by metalorganic chemical vapor deposition (MOCVD), molecular beam epitaxy (MBE), or sputtering.

For the source of Al for the AlN layer 20, trimethylaluminum (TMA) can be used. Meanwhile, for the N source, ammonia (NH$_3$) gas can be used. Those source gases can be used to form the AlN layer 20 using hydrogen gas as a carrier gas.

The temperature for growing the AlN layer 20 is preferably, but not limited to, 1270° C. or more and 1350° C. or less, and more preferably 1290° C. or more and 1330° C. or less. With this temperature range, the crystallinity of the AlN layer 20 can be improved when heat treatment is performed after that. Further, the growth pressure in the chamber can be, for example, 5 Torr to 20 Torr. The growth temperature is more preferably 8 Torr to 15 Torr.

The molar ratio of a group V element gas such as $NH_3$ gas to a group III element gas such as TMA gas, calculated based on the growth gas flow rates of the group V element gas and the group III element gas (hereinafter referred to as V/III ratio) can be, for example, 130 or more and 190 or less. The molar ratio is more preferably 140 or more and 180 or less. Note that since the optimum V/III ratio depends on the growth temperature and the growth pressure, the growth gas flow rate is preferably determined appropriately.

Subsequently, the AlN layer 20 on the sapphire substrate 10, obtained as described above is preferably subjected to a heat treatment at a temperature higher than the growth temperature of the AlN layer 20. The heat treatment process can be performed using a known heat treatment furnace. Performing the heat treatment allows the half width of the X-ray rocking curve of the (10-12) plane of the AlN layer 20 to be 400 s or less; thus, high crystallinity can be achieved.

After that, an undoped AlGaN layer is preferably formed on the AlN layer 20. A layer made of an AlGaN material can be formed using TMA as an Al source, trimethylgallium (TMG) as a Ga source, and $NH_3$ gas as an N source. This also applies to the formation of the n-type layer 30, the n-type guide layer, the light emitting layer 40, the final barrier layer, the AlN guide layer 50, the electron blocking layer 60, and the p-type contact layer 70 to be described. These source gases may be supplied into a chamber using hydrogen gas, nitrogen gas, or a mixed gas of hydrogen and nitrogen as a carrier gas. The V/III ratio calculated based on the growth gas flow rate of the group V element gas such as $NH_3$ gas to that of the group III element gas such as TMA gas can be, for example, 100 or more and 100000 or less. More preferably, the V/III ratio is 300 or more and 30000 or less. Since the optimum V/III ratio depends on the growth temperature and the growth pressure, the growth gas flow rate is preferably determined appropriately as with the case of forming the AlN layer 20.

Next, the step of forming the n-type layer 30 is performed. The n-type layer 30 can be formed on the AlN layer 20, preferably on an undoped AlGaN layer. The n-type purity is as described above.

Subsequently, the step of forming the light emitting layer 40 is performed. To adjust the Al composition ratio in forming the well layers 40$w$ and the barrier layers 40$b$, the ratio between the flow rate of the Al source and the flow rate of the Ga source may be appropriately changed. When the light emitting layer 40 is made of an AlGaN material, the growth temperature is preferably 1000° C. or more and 1400° C. or less, more preferably 1050° C. or more and 1350° C. or less.

Next, the AlN guide layer 50 is preferably formed on the light emitting layer 40. In this case, the AlN guide layer 50 is preferably epitaxially grown directly on the light emitting layer 40 using a source gas composed of trimethylaluminum gas (TMA gas) and ammonia gas ($NH_3$ gas). In order to deliberately avoid the inclusion of other group III elements such as Ga, the source gas is particularly preferably composed of only trimethylaluminum gas (TMA gas) and ammonia gas ($NH_3$ gas). A carrier gas containing nitrogen as a main component is preferably used as the carrier gas, and a nitrogen gas is more preferably used as the carrier gas. The growth temperature is preferably 1000° C. or more and 1400° C. or less, more preferably 1050° C. or more and 1350° C. or less. The AlN guide layer 50 can be made to have a thickness of 0.5 nm or more and 2.0 nm or less by appropriately selecting the growth time.

Next, the step of forming the electron blocking layer 60 on the AlN guide layer 50 is performed, followed by the step of forming the p-type contact layer 70 on the p-type electron blocking layer 60.

As described above, the electron blocking layer 60 includes the co-doped region layer 60$c$. For example, Si and Mg may be used as impurities for forming the co-doped region layer 60$c$. For the Si source, monosilane ($SiH_4$) or the like can be used, and for the Mg source, bis(cyclopentadienyl)magnesium ($CP_2Mg$) can be used. In order to perform doping using a mixture of Si and Mg, a mixed gas of the two gases may be supplied into the chamber.

For example, an impurity for forming the p-type contact layer 70 may be appropriately selected from Mg, Zn, etc. For the Mg source, bis(cyclopentadienyl)magnesium ($CP_2Mg$) can be used, and for the Zn source, $ZnCl_2$ can be used. When doping is performed using a mixture of a plurality of impurities, a mixed gas of the sources of the impurities may be supplied into the chamber.

Further, a region of the p-type contact layer that is in contact with the p-type electrode may be heavily doped with a p-type impurity. In order to perform the heavy doping, it is preferred that the supply of the group III element source gas is stopped or the flow rate of the gas is reduced to ¼ or less of the flow rate during the growth after the growth of the p-type contact layer so that only the Mg source gas and the group V element source gas are supplied to the surface of the p-type contact layer for 1 min to 20 min.

Here, when the electron blocking layer 60 is formed of an $Al_zGa_{1-z}N$ material, the p-type electron blocking layer 60 may be formed using a gas mainly containing hydrogen as a carrier gas. As described above, TMA, TMG, and $NH_3$ gases are used as source gases, and an impurity source gas is appropriately selected and used. Note that when the AlN guide layer 50 is formed using nitrogen gas as a carrier gas, and the electron blocking layer 60 is formed using hydrogen as a carrier gas, the carrier gases are necessarily switched. In this case, after forming the AlN guide layer 50, the supply of the TMA gas is stopped and switched to the supply of the carrier gas from nitrogen to hydrogen, and after a lapse of approximately 20 s to 1 min, TMA gas and TMG gas are supplied, thus forming the electron blocking layer 60.

Finally, after parts of the light emitting layer 40, the AlN guide layer 50, the electron blocking layer 60, and the p-type contact layer 70 are removed for example by etching, the n-type electrode 80 is formed on the exposed n-type layer 30, and the p-type electrode 90 is formed on the p-type contact layer 70. In this manner, the III-nitride semiconductor light-emitting device 100 can be produced.

EXAMPLES

The III-nitride light-emitting devices according to this disclosure will be described in more detail below using examples. However, this disclosure is not limited to the following examples in any way.

Example 1

A sapphire substrate (diameter: 2 in, thickness: 430 μm, plane orientation: (0001), off-angle θ in m-axis direction: 0.5°) was prepared. Next, an AlN layer having a center thickness of 0.60 μm (average thickness: 0.61 μm) was grown on the above sapphire substrate by MOCVD to obtain an AlN template substrate. Here, the growth temperature of the AlN layer was 1300° C., the growth pressure in the chamber was 10 Torr, and the growth gas flow rates of ammonia gas and TMA gas were set so that the V/III ratio was 163. The flow rate of the group V element gas (NH$_3$) was 200 sccm, and the flow rate of the group III element gas (TMA) was 53 sccm. For the thickness of the AlN layer, the thicknesses of total 25 portions distributed at regular intervals, including the center of the wafer plane were measured using an interference thickness measurement system (Nanospec M6100A manufactured by Nanometrics Incorporated).

Next, the above AlN template substrate was introduced into a heat treatment furnace. After the pressure of the furnace was reduced to 10 Pa, the furnace was purged with nitrogen gas to achieve a nitrogen gas atmosphere in the furnace, and the temperature inside the furnace was then raised, thus performing heat treatment on the AlN template substrate. The heat treatment was performed at a heating temperature of 1650° C. for a heating time of four hours.

Subsequently, an undoped $Al_{0.7}Ga_{0.3}N$ layer made of $Al_{0.7}Ga_{0.3}N$ with a thickness of 1 μm was formed as an undoped AlGaN layer by MOCVD. Next, as an n-type layer, a Si-doped n-type layer made of n-type $Al_{0.65}Ga_{0.35}N$ was formed to a thickness of 2 μm. According to a result of SIMS analysis, the Si concentration of the n-type layer was $1.0 \times 10^{19}$ atoms/cm$^3$.

Subsequently, a Si-doped n-type guide layer made of $Al_{0.65}Ga_{0.35}N$ was formed to a thickness of 20 nm on the n-type layer, and $Al_{0.65}Ga_{0.35}N$ was then formed as a barrier layer to a thickness of 4 nm. Next, two well layers made of $Al_{0.45}Ga_{0.55}N$ with a thickness of 3 nm and two barrier layers made of $Al_{0.65}Ga_{0.35}N$ with a thickness of 4 nm were alternately formed, and another well layer made of $Al_{0.45}Ga_{0.55}N$ with a thickness of 3 nm was formed thereon. In the formation of the barrier layer, the barrier layer was doped with Si.

After that, on the third well layer, an undoped AlN guide layer was formed using nitrogen gas as a carrier gas. The thickness of the AlN guide layer was 1 nm.

Next, while the supply of the TMA gas was ceased and ammonia gas was continuously supplied, nitrogen that was the carrier gas was ceased and hydrogen was supplied. After the carrier gas was changed to hydrogen, the supply of TMA gas and TMG gas that are source gases of group III elements was resumed, thus a Mg-doped electron blocking layer made of $Al_{0.68}Ga_{0.32}N$ was formed to a thickness of 18 nm. Next, an electron blocking layer (co-doped region layer) made of $Al_{0.68}Ga_{0.32}N$ doped with Mg and Si was formed to a thickness of 2 nm, thus the two electron blocking layers formed an electron blocking layer having a total thickness of 20 nm.

Note that when doping with Mg and Si was performed to form the co-doped region layer, SiH$_4$ gas was supplied at 8 sccm, and Cp$_2$Mg gas was supplied at 250 sccm both into the chamber. According to SIMS analysis, the Si concentration of the region of the electron blocking layer that was doped with Mg and Si was $2.0 \times 10^{19}$ atoms/cm$^3$, and the Mg concentration thereof was $2.0 \times 10^{19}$ atoms/cm$^3$.

Subsequently, after the carrier gas was switched to nitrogen gas, a Mg-doped p-type contact layer made of GaN was formed to a thickness of 300 nm. In the p-contact layer with a thickness of 300 nm, a region that is to be in contact with the p-type electrode and has a thickness of 25 nm is formed into a layer having a high Mg concentration region by both reducing the flow rate of the TMG gas to increase the existence probability of Mg and reducing the growth rate. According to SIMS analysis, the mean Mg concentration of the p-type contact layer on the p-type electron blocking layer side was $3.0 \times 10^{19}$ atoms/cm$^3$, and the mean Mg concentration of the high Mg concentration region was $1.2 \times 10^{20}$ atom/cm$^3$.

After that, a mask was formed on the p-type contact layer, and mesa etching was performed by dry etching to expose a part of the n-type layer. Next, a p-type electrode made of Ni/Au was formed on the p-type contact layer, and an n-type electrode made of Ti/Al was formed on the exposed n-type layer. Note that the p-type electrode had Ni with a thickness of 50 angstrom and Au with a thickness of 1500 angstrom. Further, the n-type electrode had Ti with a thickness of 200 angstrom and Al with a thickness of 1500 angstrom. Finally, contact annealing (RTA) was performed at 550° C. to finish the electrodes.

The specifications of each layer in the III-nitride semiconductor light-emitting device produced as described above are given in Table 1.

TABLE 1

| | Al composition ratio | Impurity | Thickness |
|---|---|---|---|
| p-type contact layer | 0 | Mg | 300 nm |
| p-type electron blocking layer | 0.68 | Mg and Si | 2 nm |
| | | Mg | 18 nm |
| AlN guide layer | 1 | — | 1 nm |
| Light emitting layer | 0.45 | — | 3 nm |
| | 0.65 | Si | 4 nm |
| | 0.45 | — | 3 nm |
| | 0.65 | Si | 4 nm |
| | 0.45 | — | 3 nm |
| | 0.65 | Si | 4 nm |
| n-type guide layer | 0.65 | Si | 20 nm |
| n-type layer | 0.65 | Si | 2 μm |
| Undoped layer (With composition graded layer) | 0.7 | — | 1 μm |
| AlN layer | 1 | — | 0.6 μm |
| Sapphire substrate | — | — | 430 μm |

Example 2

A III-nitride semiconductor light-emitting device was produced in the same manner as in Example 1 except that the thickness of the p-type contact layer was 600 nm.

Example 3

A III-nitride semiconductor light-emitting device was produced in the same manner as in Example 1 except that the thickness of the p-type contact layer was 900 nm.

Example 4

A III-nitride semiconductor light-emitting device was produced in the same manner as in Example 1 except that the thickness of the p-type contact layer was 1200 nm.

Example 5

A III-nitride semiconductor light-emitting device was produced in the same manner as in Example 1 except that the thickness of the p-type contact layer was 600 nm, and the total thickness of the p-type electron blocking layer was 30 nm. Of the total thickness of 30 nm, the thickness of the region consisting of only Mg was 28 nm, and the thickness of the co-doped region layer was 2 nm.

Example 6

A III-nitride semiconductor light-emitting device was produced in the same manner as in Example 1 except that the thickness of the p-type contact layer was 900 nm, and the total thickness of the p-type electron blocking layer was 30 nm. Of the total thickness of 30 nm, the thickness of the region consisting of only Mg was 28 nm, and the thickness of the co-doped region layer was 2 nm.

Example 7

A III-nitride semiconductor light-emitting device was produced in the same manner as in Example 1 except that the thickness of the p-type contact layer was 900 nm, and the total thickness of the p-type electron blocking layer was 25 nm. Of the total thickness of 25 nm, the thickness of the region consisting of only Mg was 23 nm, and the thickness of the co-doped region layer was 2 nm.

Comparative Example 1

A III-nitride semiconductor light-emitting device was produced in the same manner as in Example 1 except that the thickness of the p-type contact layer was 150 nm.

Comparative Examples 2 to 5

III-nitride semiconductor light-emitting devices of Comparative Examples 2 to 5 were produced in the same manner as in Comparative Example 1 and Examples 1 to 3, respectively, except that the p-type electron blocking layer was not doped with Si.

Comparative Example 6

A III-nitride semiconductor light-emitting device was produced in the same manner as in Comparative Example 1 except that the p-type electron blocking layer was not doped with Si and the thickness of the p-type electron blocking layer was 40 nm.

Comparative Example 7

A III-nitride semiconductor light-emitting device was produced in the same manner as in Example 3 except that the p-type electron blocking layer was not doped with Si and the thickness of the p-type electron blocking layer was 40 nm.

(Evaluation 1: Evaluation of Thickness and Al Composition Ratio of Each Layer)

The thickness of each layer formed by epitaxial growth was measured using an optical interferometric thickness measurement system and a transmission electron microscope. Further, for layers including barrier layers and the electron blocking layer that each had a thickness as small as several nanometers to several tens of nanometers, the thickness and the Al composition ratio of each layer was measured by TEM-EDS by performing a cross-sectional observation under the transmission electron microscope. For layers having a sufficiently large thickness (1 μm or more), the Al composition ratio of each target layer was found from the emission wavelength (band gap energy) determined by a photoluminescence measurement.

(Evaluation 2: Light Output Power and Emission Wavelength)

The light output power was measured by passing a current at 10 mA through a Si photodiode (S1227-1010BQ manufactured by Hamamatsu Photonics K. K.) through In balls. Further, the emission wavelength was also measured at a current of 10 mA using a fiber optics spectrometer (USB2000+ manufactured by Ocean Photonics).

(Evaluation 3: Change in Light Output Power with Time)

Each light-emitting device was mounted on an MN submount, and change in the light output power with time in the case of continuously energizing the device with a current of 350 mA was measured. When the ratio of the light output power after continuously energizing the light-emitting device for 165 h to the initial light output power was 70% or more, the device was marked with "+", whereas when it was less than 70%, the device was marked with "−". Further, change in the light output power with time in the case of continuously energizing each device with a current of 600 mA was measured. The ratio of the light output power after continuously energizing the light-emitting device for 500 h to the initial light output power is also given with the measured value in Table 2.

Figure 2:
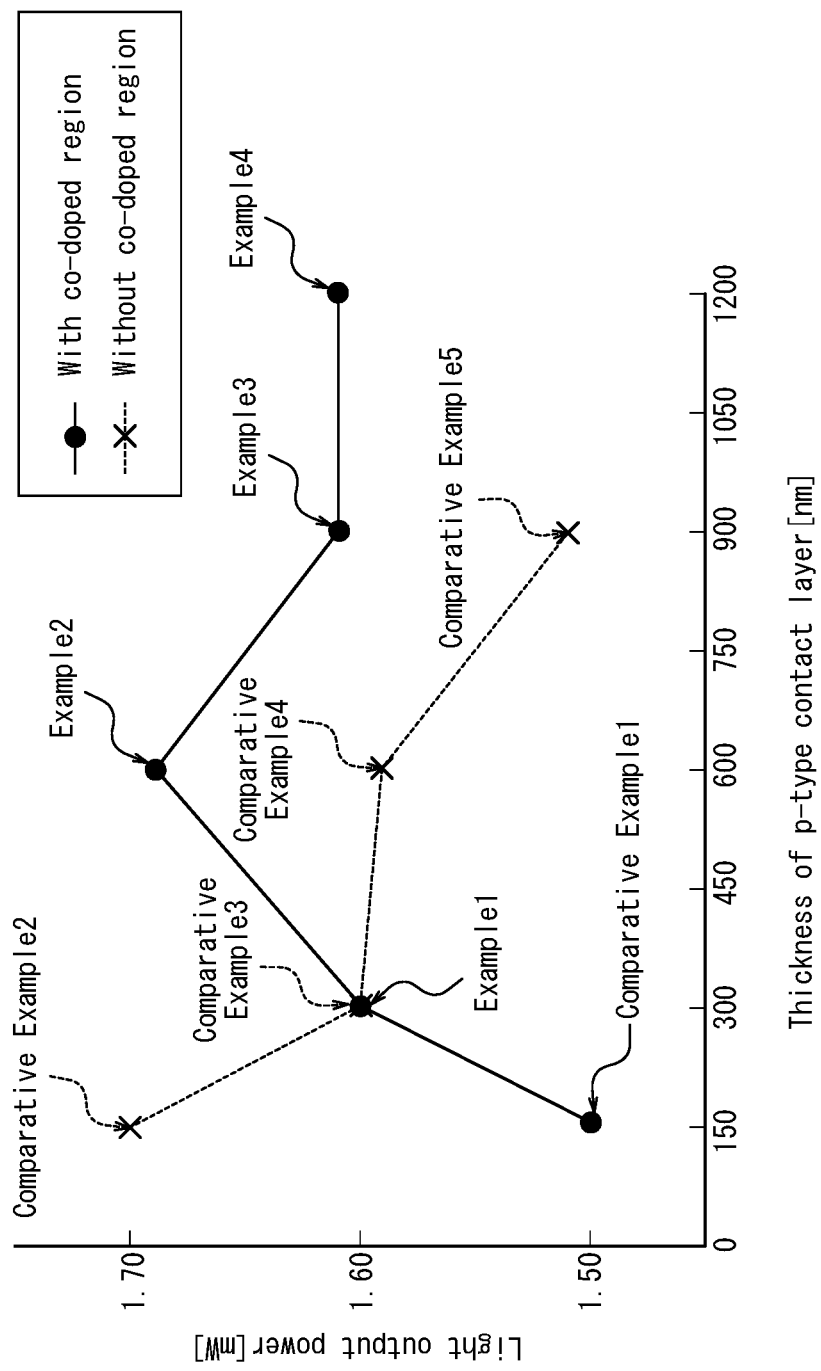
FIG. 2 is a graph illustrating the correlation between the thickness of a p-type contact layer and the light output power in Examples.

The evaluation results of the III-nitride semiconductor light-emitting devices according o Examples 1 to 7 and Comparative Examples 1 to 7 are given in Table 2. Further, the correlation between the thickness of the p-type contact layer and the light output power in Examples 1 to 4 and Comparative Examples 1 to 5, in each of which the thickness of the electron blocking layer was 20 nm is illustrated in the graph of FIG. 2.

TABLE 2

| | Thickness of p-type contact layer (nm) | Impurity for electron blocking layer | Thickness of electron blocking layer-film (nm) | Light output power (mW) | (350 mA energization) change in light output power with time | (600 mA energization) change in light output power with time (%) |
|---|---|---|---|---|---|---|
| Comparative Example 1 | 150 | Mg and Si | 20 | 1.50 | + | 77 |
| Example 1 | 300 | Mg and Si | 20 | 1.60 | + | 77 |
| Example 2 | 600 | Mg and Si | 20 | 1.69 | + | 77 |
| Example 3 | 900 | Mg and Si | 20 | 1.61 | + | 80 |
| Example 4 | 1200 | Mg and Si | 20 | 1.61 | + | 80 |
| Example 5 | 600 | Mg and Si | 30 | 1.60 | + | 78 |
| Example 6 | 900 | Mg and Si | 30 | 1.53 | + | 81 |
| Example 7 | 900 | Mg and Si | 25 | 1.60 | + | 80 |
| Comparative Example 2 | 150 | Mg | 20 | 1.70 | − | 69 |

TABLE 2-continued

|  | Thickness of p-type contact layer (nm) | Impurity for electron blocking layer | Thickness of electron blocking layer-film) | Light output power (mW) | (350 mA energization) change in light output power with time | (600 mA energization) change in light output power with time (%) |
|---|---|---|---|---|---|---|
| Comparative Example 3 | 300 | Mg | 20 | 1.60 | – | 62 |
| Comparative Example 4 | 600 | Mg | 20 | 1.59 | – | 50 |
| Comparative Example 5 | 900 | Mg | 20 | 1.51 | – | 65 |
| Comparative Example 6 | 150 | Mg | 40 | 1.50 | + | 76 |
| Comparative Example 7 | 900 | Mg | 40 | 1.40 | + | 82 |

First, the results of Comparative Examples 6 and 7 in Table 2 demonstrate that when the electron blocking layer was not doped with Si and the thickness of the electron blocking layer was 40 nm, although change in the light output power with time was small, the light output power was low. The results of Comparative Examples 2 to 5 demonstrate that when the thickness of the electron blocking layer was reduced to 20 nm, change in the light output power with time was unfavorable (evaluation: "−") and that as the thickness of the p-type contact layer was larger, the light output power was likely smaller. The likeliness of the light output power being lower as the thickness of the p-type contact layer was larger in each of Comparative Examples 2 to 5 was as have been suggested by conventional studies. On the other hand, in contrast to the results of these Comparative Examples, the results of Examples 1 to 7 demonstrate that when the electron blocking layer was doped with Si, change in the light output power with time was small and the light output power was large as compared with Comparative Example 1. Moreover, as indicated by Example 2, a thickness of the p-type contact layer in a certain range that is larger than the thickness in conventional devices will result in the highest light output power (see FIG. 2 as well). Further, comparisons between Examples 2 and 5, and Examples 3, 6, and 7 confirm that the electron blocking layer is preferably thinner.

INDUSTRIAL APPLICABILITY

This disclosure provides a III-nitride semiconductor light-emitting device that can reduce change in the light output power with time and has more excellent light output power compared with conventional devices.

REFERENCE SIGNS LIST

10: Substrate
10A: Main surface of substrate
20: MN layer
30: n-type layer
40: Light emitting layer
40b: Barrier layer
40w: Well layer
50: MN guide layer
60: Electron blocking layer
70: p-type contact layer
80: n-type electrode
90: p-type electrode
100: III-nitride semiconductor light-emitting device

The invention claimed is:

1. A III-nitride semiconductor light-emitting device having an emission wavelength of 200 nm to 350 nm, comprising an n-type layer, a light emitting layer, an electron blocking layer, and a p-type contact layer in this order,
    wherein the electron blocking layer has a co-doped region layer,
    the p-type contact layer is made of p-type $Al_xGa_{1-x}N$ ($0 \leq x \leq 0.1$), and
    a thickness of the p-type contact layer is 300 nm or more.

2. The III-nitride semiconductor light-emitting device according to claim 1, wherein the thickness of the p-type contact layer is 500 nm or more and 1500 nm or less.

3. The III-nitride semiconductor light-emitting device according to claim 1, wherein a thickness of the electron blocking layer is 10 nm or more and 30 nm or less.

4. The III-nitride semiconductor light-emitting device according to claim 1, wherein the co-doped region layer contains a p-type impurity at $1 \times 10^{18}$ atoms/cm$^3$ to $1 \times 10^{20}$ atoms/cm$^3$ and an n-type impurity at $1 \times 10^{18}$ atoms/cm$^3$ to $1 \times 10^{20}$ atoms/cm$^3$.

5. The III-nitride semiconductor light-emitting device according to claim 4, wherein the p-type impurity in the co-doped region layer is Mg, and the n-type impurity in the co-doped region layer is Si.

6. A method of producing a III-nitride semiconductor light-emitting device having an emission wavelength of 200 nm to 350 nm, comprising a step of forming an n-type layer, a step of forming a light emitting layer, a step of forming an electron blocking layer, and a step of forming a p-type contact layer,
    wherein the step of forming the electron blocking layer includes a step of forming a co-doped region layer in the electron blocking layer, and
    in the step of forming the p-type contact layer, the p-type contact layer is made of p-type $Al_xGa_{1-x}N$ ($0 \leq x \leq 0.1$), and a thickness of the p-type contact layer is 300 nm or more.

* * * * *